United States Patent
Shieh et al.

(10) Patent No.: US 9,608,017 B2
(45) Date of Patent: Mar. 28, 2017

(54) REVERSED FLEXIBLE TFT BACK-PANEL BY GLASS SUBSTRATE REMOVAL

(71) Applicants: Chan-Long Shieh, Paradise Valley, AZ (US); Fatt Foong, Goleta, CA (US); Gang Yu, Santa Barbara, CA (US); Guangming Wang, Santa Barbara, CA (US)

(72) Inventors: Chan-Long Shieh, Paradise Valley, AZ (US); Fatt Foong, Goleta, CA (US); Gang Yu, Santa Barbara, CA (US); Guangming Wang, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 0 days.

(21) Appl. No.: 14/635,865

(22) Filed: Mar. 2, 2015

(65) Prior Publication Data
US 2016/0260752 A1 Sep. 8, 2016

(51) Int. Cl.
*H01L 27/12* (2006.01)
*H01L 29/786* (2006.01)
*H01L 51/05* (2006.01)
*H01L 51/56* (2006.01)

(52) U.S. Cl.
CPC ...... *H01L 27/1266* (2013.01); *H01L 27/1222* (2013.01); *H01L 27/1225* (2013.01); *H01L 29/7869* (2013.01); *H01L 29/78669* (2013.01); *H01L 29/78678* (2013.01); *H01L 51/0545* (2013.01); *H01L 51/56* (2013.01); *H01L 2227/323* (2013.01); *H01L 2227/326* (2013.01)

(58) Field of Classification Search
CPC .............................. H01L 21/775; H01L 27/12
USPC .............................................. 438/25, 30, 464
See application file for complete search history.

(56) References Cited

U.S. PATENT DOCUMENTS 6,627,953 B1 * 9/2003 Vu ........................ A61B 3/113
257/347
9,240,437 B2 * 1/2016 Shieh .................. H01L 27/3244

* cited by examiner

*Primary Examiner* — Quoc Hoang
(74) *Attorney, Agent, or Firm* — Robert A. Parsons; Michael W. Goltry; Parsons & Goltry

(57) ABSTRACT

The process of fabricating a flexible TFT back-panel includes depositing etch stop material on a glass support. A matrix of contact pads, gate electrodes and gate dielectric are deposited overlying the etch stop material. Vias are formed through the dielectric in communication with each pad. A matrix of TFTs is formed by depositing and patterning metal oxide semiconductor material to form an active layer of each TFT overlying the gate electrode. Source/drain metal is deposited on the active layer and in the vias in contact with the pads, the source/drain metal defining source/drain terminals of each TFT. Passivation material is deposited in overlying relationship to the TFTs. A color filter layer is formed on the passivation material and a flexible plastic carrier is affixed to the color filter. The glass support member and the etch stop material are then etched away to expose a surface of each of the pads.

18 Claims, 3 Drawing Sheets

REVERSED FLEXIBLE TFT BACK-PANEL BY GLASS SUBSTRATE REMOVAL

FIELD OF THE INVENTION

This invention generally relates to a method of fabricating an inverted flexible TFT back-panel on a glass substrate and the removal of the glass substrate after critical processing steps and before completion of the front panel display/imaging/sensor array.

BACKGROUND OF THE INVENTION

There is a strong interest in flexible TFT back-panels because of the strong interest in wearable electronics. The key challenge in this endeavor is the substrate. To make devices with good electrical performance, the substrate has to survive high temperature processing steps and all kinds of chemical treatment without dimension deformations. Furthermore, the substrate has to remain flat for lithography purposes. No flexible substrate can achieve this requirement. The only solution is to mount the flexible substrate onto a flat and rigid substrate such as glass or ceramic (hereinafter generically referred to as 'glass') supporting sheet by adhesive for processing purposes and removal of the substrate by de-bonding after critical processing steps are completed.

There are a lot of challenges in finding the adhesive or glues and suitable flexible substrates that can maintain the dimension stability required. For most flexible substrates the coefficient of thermal expansion (CTE) is 50 to 100 ppm per degree Celsius. But for glass substrates the CTE is only a few ppm per degree Celsius. Therefore, during temperature rise of 300 degrees Celsius (common temperature required during normal processing), the plastic deformation can be as large as a few percent. Thus, there will be a strong stress to bend the glass substrate and it will be difficult for it to remain flat and to hold its shape. The thicker the plastic substrate, the stronger the force or stress is. For typical plastic substrates of 100 to 200 microns thick, the force is so strong that even the glass supporting sheet is bent. So it is advantageous to have the plastic substrate as thin as possible. But conversely, the plastic substrate has to be sufficiently thick to deal with handling after de-bonding.

The de-bonding process is also tedious and can require high temperature or laser illumination (depending upon the adhesive). The de-bonding process can damage the backplane and may not be compatible with display/sensor device processing, such as OLEDs or organic photodiodes. The OLED or organic photodiode cannot survive temperatures over 150 degrees Celsius. Even finished LCD cells cannot survive the high temperature that is normally required for de-bonding. Because of the potential damage to the electronic devices in the back-panel, the de-bonding process may be forced to be carried out before the display/sensor device processing is performed. If de-bonding has to be performed before display/sensor device processing, the display/sensor device processing has to be carried out on the flexible substrate, which is more difficult to accomplish. Therefore, it is very difficult to manufacture good flexible back-panels and flexible displays/sensors.

The advance of metal oxide TFTs (MOTFT) enables high performance TFTs to be fabricated at lower processing temperatures. However, decrease in performance and stability is still an issue even for MOTFTs made at low temperature. It is advantageous to be able to make flexible back-panels at high temperatures up to 300 degrees Celsius. Thus, the use of a rigid supporting element to hold a flexible substrate rigid during processing is still desirable.

In the prior art various attempts to fabricate flexible substrates on glass supports have been made. One example is described in U.S. Pat. No. 8,258,694, entitled "Method for Manufacturing Flexible Display Device Having an Insulating Overcoat and Flexible Display Device Having the Same", issued Sep. 4, 2012 and a divisional thereof, U.S. Pat. No. 8,257,129. In this type of process, an insulating protection layer is formed on a rigid substrate (e.g. glass). Display elements are formed on the insulating protection layer and a flexible substrate is formed in an overlying relationship on the display elements. The rigid substrate is then removed by etching or the like. To perform the etching step, the material of the rigid substrate must have at least an etching selectivity 20 times greater than the insulating protection layer. It is important to note that the insulating protection layer does not stop the etching but is only etched at a much slower rate. That is to say, in all known prior art some of the insulating protection layer is removed in the process of etching the glass substrate. Since the amount removed affects the efficiency of the insulating protective layer (i.e. the protection provided by the layer) some compensation must be provided in advance. However, forming a thicker insulating protection layer in advance increases the stress on the glass substrate. Generally, many of these prior art fabrication methods have either been extremely difficult to use, usually because of the severe requirement for the selection of materials, or have failed completely because the etching step is too rigorous.

It would be highly advantageous, therefore, to remedy the foregoing and other deficiencies inherent in the prior art.

Accordingly, it is an object of the present invention to provide a new and improved process for fabricating an inverted flexible TFT back-panel on a glass support.

It is another object of the present invention to provide a new and improved process for fabricating an inverted flexible TFT back-panel on a glass support member wherein a step of removing the glass support member is performed prior to formation of display/sensor device processing.

It is another object of the present invention to provide a new and improved process for fabricating an inverted flexible TFT back-panel on a glass support member wherein steps of removing the glass support member and inverting the TFT back-panel are performed prior to formation of display/sensor device processing.

It is another object of the present invention to provide a new and improved process for fabricating an inverted flexible TFT back-panel on a glass support member wherein steps involving high temperatures or high resolution are performed in an appropriate order with the glass support member attached to reserve performance of the TFT array.

It is another object of the present invention to provide a new and improved process for fabricating flexible/conformable electronic array devices with processes requiring pixel level registration carried out with a dimension stable rigid supporting substrate and with other processes that do not need pixel level registration carried out after removing the rigid supporting substrate. It is another object of the present invention to provide a flexible/conformable TFT backpanel array devices for non-planar, wearable electronic devices, including displays, digital imagers, chemical and bio-sensors.

SUMMARY OF THE INVENTION

The desired objects of the present invention are achieved in accordance with a process of fabricating a flexible TFT back-panel on a glass support including the steps of providing a flat glass support member having an upper surface depositing a layer of etch stop material on the upper surface of the glass support member, depositing a display/imager/sensor pixel element contact pad overlying the layer of etch stop material, depositing gate metal overlying the etch stop material and patterning the gate metal to define a gate electrode of a TFT and connecting lines, depositing a layer of gate dielectric material overlying the contact pad and the gate metal, and forming a via through the layer of gate dielectric material in communication with the contact pad. The process further includes the steps of forming a matrix of TFTs by depositing and patterning metal oxide semiconductor material to form an active layer of the TFT overlying the gate electrode, depositing source/drain contact metal on the active layer and in the via in electrical contact with the contact pad and patterning the source/drain contact metal to define source and drain terminals of each TFT, depositing a layer of passivation material in overlying relationship to the TFT, forming a color filter on the layer of passivation material, and affixing a flexible plastic carrier to the color filter. The glass support member and the layer of etch stop material are then etched away to expose a surface of the light emitting/modulating element contact pads.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
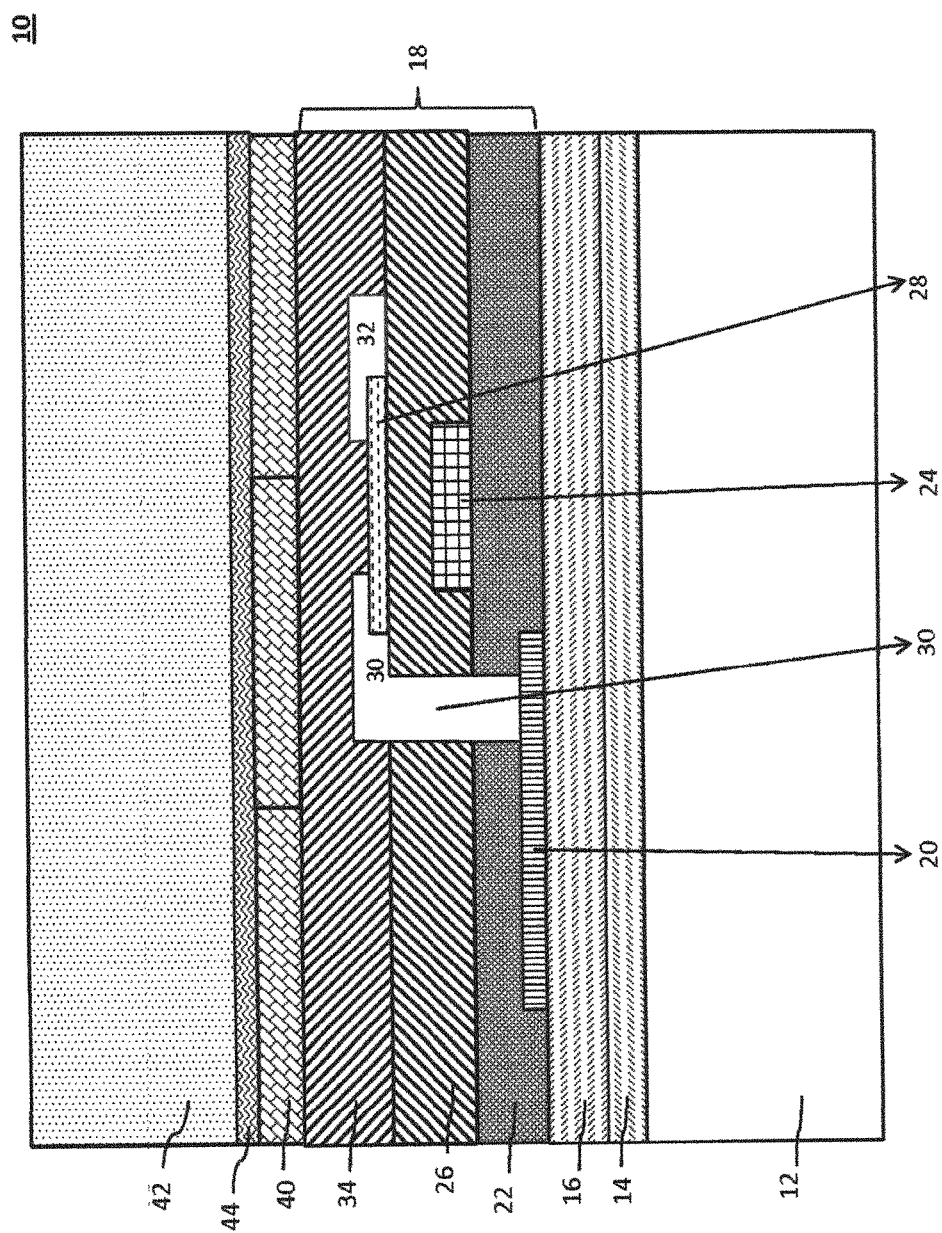
FIG. 1 is a simplified layer diagram illustrating a flexible TFT back-panel on a glass support member and steps in the fabrication thereof, in accordance with the present invention.

Turning to FIG. 1, various steps in a fabrication process for a flexible TFT back-panel 10 are illustrated. In this specific instance a rigid support member (hereinafter substrate 12) includes a flat glass panel, which is a preferred support member and will be used as an example herein although other materials may be used in specific applications. It should also be understood that the thickness of glass substrate 12 is not critical except that it must be thick enough to prevent any bending during the fabrication process and will generally be as thin as practical to reduce the ultimate etching time.

An etch stop layer 14 is deposited on glass substrate 12 and includes any material that will stop the etching process once glass substrate 12 has been removed. As is known in the art, etching of glass substrate 12 is best performed by hydrofluoric acid (HF) and the best etch stop material is a thin layer of noble metal, such as Au, Pt, Pd, or a thin layer of transition metal in 5B and 6B columns of the periodic table, such as V, Nb, Ta, Cr, Mo, and W, and mixtures or multilayer stacks thereof. In some instances it may be desirable to enhance the adhesion of the layer of noble metal to overlying and underlying materials. Such enhancement can be provided by optional thin glue layers (not visible within layer 14) such as Cr, Ti, Ni, or mixtures thereof applied to the top and/or bottom of layer 14. It should be specifically noted that once glass substrate 12 is removed any noble metal (e.g. Au used in etch stop layer 14) can be recycled or reclaimed to reduce the cost.

Another option for etch stop layer 14 is a thin layer of amorphous silicon (a-Si) deposited on glass substrate 12 by PECVD. It should be noted that a-Si itself cannot survive the HF etch process. However, by thermally crystallizing the a-Si into poly-Si at a temperature above 500° C., the resulting poly-Si can survive the HF etch process. Since the crystallization step is carried out before any additional layer deposition and TFT processing, the high temperature step does not cause any problem.

Etch stop layer 14 should be as thin as possible to reduce the time required for application and removal, if required or preferred. It has been found that a thickness of less than 200 nm provides sufficient protection and, preferably, etch stop layer 14 is 100 nm or thinner. Here it should be noted that in the prior art, even with the glass substrate having an etching selectivity 20 times greater than the insulating protection layer, the insulating protection layer would have to be much thicker than 200 nm to withstand the etching removal of the glass substrate.

An insulating optional buffer layer 16 (i.e. an insulating protection layer) is deposited on etch stop layer 14 by any convenient process, such as spin coating, slot coating, or plasma enhanced CVD. Insulating buffer layer 16 can be deposited directly on etch stop layer 14 since there is no need for glue or other adhesive materials (except for the optional Cr, Ti, Ni, or mixtures mentioned above used to enhance the adhesion). Generally, insulating buffer layer 16 is chosen so that it can survive MOTFT process temperatures up to 300 degrees Celsius, since it is advantageous to be able to process MOTFTs at temperatures up to 300 degrees Celsius for improved characteristics. Some well-known insulating materials that have this property include, for example, polyimide, bisbenzocyclobutene (BCB), and polytetrafluroethylene (PTFE), or the like, any of which can be deposited by spin coating, slot coating, spray coating, screen printing or transfer printing. Other insulating materials, such as hexamethuldisiloxane (HMDSO), $SiO_2$, SiN and SiON can be deposited by plasma enhanced chemical vapor deposition (PECVD). The thickness of insulating buffer layer 16 is sufficiently thin (e.g. preferably 1 to 5 microns) so that glass support member 12 will remain flat (i.e. deformation is negligible) during high processing temperatures. It must be noted that for layer 16 to be formed of an effective insulating buffer material and sufficiently thin to prevent unworkable deformations of glass substrate 12, it cannot survive the subsequent etching removal of glass support member 12 by itself.

Because etch stop layer 14 is interposed between glass substrate 12 and insulating buffer layer 16, no etching or removal of insulating buffer layer 16 occurs during the step of etching glass substrate 12. Thus, it should be specifically noted that insulating buffer layer 16 can be formed initially with the optimum thickness required for insulation purposes so that stress on glass substrate 12 during the processing steps can be minimized and accuracy during lithography or other alignment procedures is enhanced. Also, insulating buffer layer 16 can be formed of optimum insulating materials, since they do not have to withstand any of the etching process.

A TFT backplane 18 is formed on insulating buffer layer 16 by any well-known process. As understood in the art, a TFT backplane includes a matrix of TFT switching circuits formed to mate with a matrix of light emitting or light modulating elements and generally organized to define a matrix of full color pixels. Generally, the light emitting or light modulating elements include organic light emitting devices (OLED) or liquid crystal devices (LCD) and full color can be achieved in a variety of embodiments, as explained, for example, in U.S. Pat. No. 8,742,658 entitled "Full Color Active Matrix Organic Light Emitting Display with Hybrid", and incorporated herein by reference. The matrix of TFT switching circuits and mating matrix of light emitting or light modulating elements may also be replaced with a plurality of light sensor devices using photodiodes, radiation detectors or any array of MEMS devices or the like in a well-known fashion to form a variety of sensor arrays. An example of pixelated image array by integration a MOTFT pixel readout circuit and a P-I-N photodiode array has been disclosed in a co-pending U.S. patent application entitled "Pixelated Imager with MOTFET and Process", filed 13 Dec. 2012, bearing Ser. No. 13/713,744, and incorporated herein by reference. Another example of forming a high pixel density image array without patterning the sensing layer has also been disclosed in a copending U.S. patent application entitled "Two-Terminal Electronic Devices and Their Methods of Fabrication", filed 23 Jul. 2014, bearing Ser. No. 14/339,210, and incorporated herein by reference. It should also be noted that the present techniques are not limited to MOTFTs but can be applied generally to all types of thin film transistor (TFT) backplanes including amorphous silicon (a-Si), polycrystalline-silicon, Cd—Se or other non-oxide compound semiconductors and TFTs made with an organic semiconductor active layer.

Referring again to FIG. 1, backplane 18 is represented by a single TFT for simplicity but it will be understood that a matrix of devices is being described. Multiple TFTs can also be used for constructing each pixel circuit, as is well known in AMOLED display and in active pixel sensing (APS) digital imagers. In this specific embodiment TFT backplane 18 includes an electrode or contact pad 20 positioned on buffer layer 16 and a planarization layer 22 deposited over electrode 20. Gate metal 24, including any connecting lines, is deposited on planarization layer 22 and a layer 26 of gate dielectric is deposited over gate metal 24. A layer of metal oxide (in this specific example) is deposited on gate dielectric layer 26 and patterned to form an active layer 28 defining a TFT. A via is formed through layers 26 and 22 and source drain metal is deposited on active layer 28 and patterned to form a first source/drain contact 30 on active layer 28 and through the via into electrical contact with electrode 20 and a second source/drain contact 32 on active layer 28 and spaced from source/drain contact 30 to define a channel area in active layer 28. In certain cases for process purpose, an optional etch-stop layer (not shown) is placed over channel area between S/D contacts (often-called etch-stop type TFT). A passivation layer 34 is deposited over source/drain contact 30 and 32 and the entire TFT and to planarize the structure. The material used for layer 34 can be either inorganic dielectric film, organic dielectric film or their combinations in multiple film stacks or in blend forms. In addition to the passivation function, proper design of the film stack or the blend film 34 can also result in optimized optical transmission at interesting wavelengths.

In many examples of light emitting devices a color filter is used to define a matrix of full color pixels. Generally, color filters cannot withstand the high heat required for TFT fabrication and also require a flat surface and at least some alignment with the individual light emitting devices. Thus, in the present embodiment it is convenient to deposit a color filter 40, if included, on passivation layer 34. Since the TFTs are already formed, color filter 40 will not be subjected to any extreme heat and will be formed on the flat surface of passivation layer 34 while the structure is still being held in place by glass substrate 12.

After TFT backplane 18 and color filter 40 are fabricated, additional packaging structure is affixed on the upper surface thereof. In this specific example the additional packaging structure is a flexible plastic carrier 42 which is affixed to the surface of color filter 40 by adhesive or glue 44. Flexible plastic carrier 42 is thick enough to act as the mechanical support for the display/sensor device after glass substrate 12 is removed. Also, one side of the display/sensor device is protected by flexible plastic carrier 42. In most instances a coating 44 of adhesive material (e.g. glue or the like) is applied to the upper surface of color filter 40 to fixedly attach flexible plastic carrier 42 thereto. In applications requiring high barrier properties for plastic carrier 42, a barrier coating at the interface between carrier 42 and coating 44 or at both surfaces of carrier 42 can be added.

For the case of image arrays, large-size flexible pixelated digital X-ray imagers have been of broad interest. The structure shown in FIG. 1 can also be used for such imaging arrays. In this case, color filter layer 40 is replaced with a flexible X-ray phosphor layer converting incident X-ray images into visible images, with either structured phosphor material (such as structured CsI), or with a blend of host polymers loaded with micro- or nano-phosphor particles (sometimes called PIB in the field). In the latter case, layer 44 and 42 may be skipped.

Figure 2:
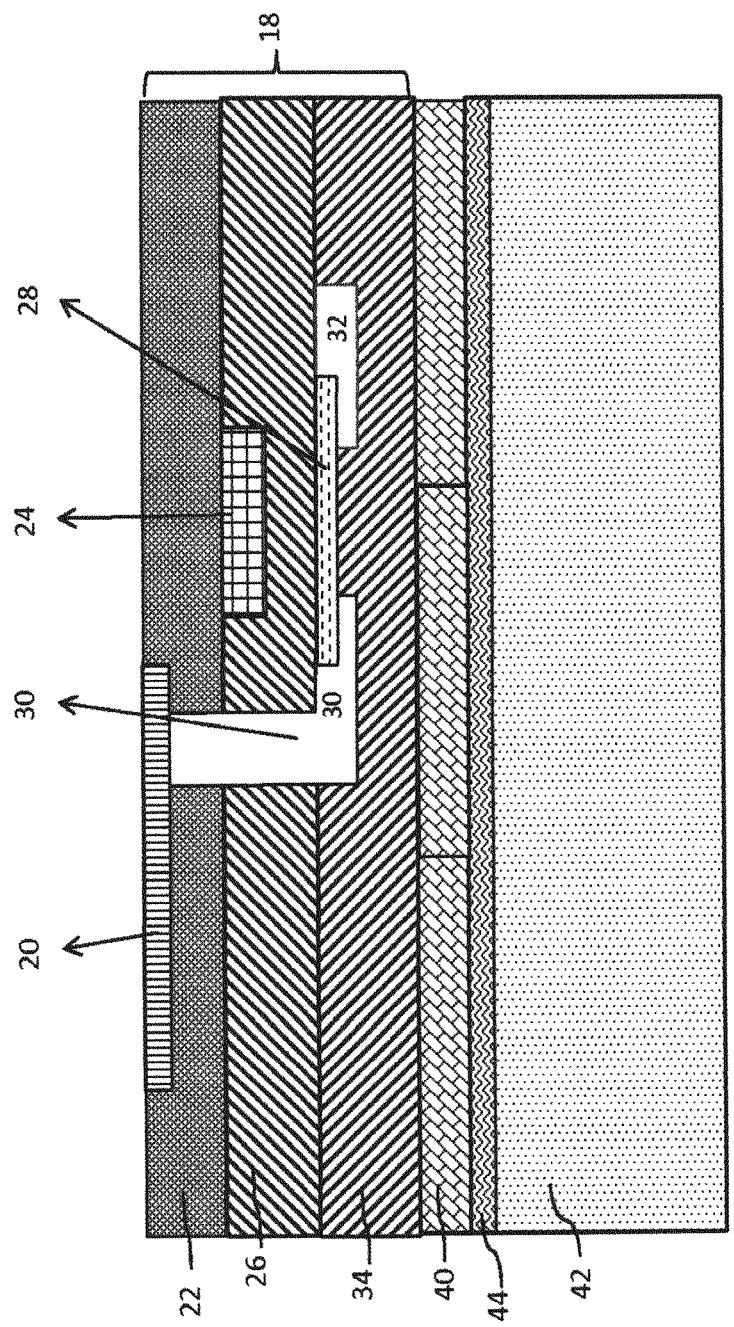
FIG. 2 is a simplified layer diagram of the flexible TFT back-panel after removal of the glass support member and inverted to receive a display/sensor device panel.

With flexible plastic carrier 42 fixedly attached to color filter 40, Glass substrate 12 can be removed (as shown in FIG. 2). For the removal process the whole structure is put into an HF bath with proper agitation. If flexible plastic carrier 42 is not resistant to HF, the sides and top of the package can be protected by an additional resist material, generally one that is easily removed after glass substrate 12 has been removed. Once glass substrate 12 is removed, etch stop layer 14 and buffer layer 16 can be removed by different etching processes. Since packaging and glass substrate removal are carried out at low temperatures (<100 degrees Celsius), there are more options in material selection for flexible plastic carrier 42. For LCD and OLED displays, an optional linear or circular polarizer layer can also be incorporated into the flexible carrier 42 near the interface between 42 and 44

As showing in FIG. 2, after removal of glass substrate 12, etch stop layer 14, and buffer layer 16 (if present), the structure is turned upside down or reversed so that pixel electrode 20 (for each TFT, or each pixel driver circuit in the array) is in the upper surface, the resulting TFT back-panel 10 can be used directly with patterned pixel electrode pads for displays/sensors. That is, electrode 20 serves as one pixel electrode or connection to the pixel circuit. Glass substrate 12 is removed before the display/sensor is fabricated. This is particularly suitable for display/sensor technologies which require only low processing temperature and without pixel level patterning. Examples of such technologies include white OLEDs with color filters and LCDs. In this case color filter 40 is formed on TFT backplane 18 before glass substrate 12 is removed.

Figure 3:
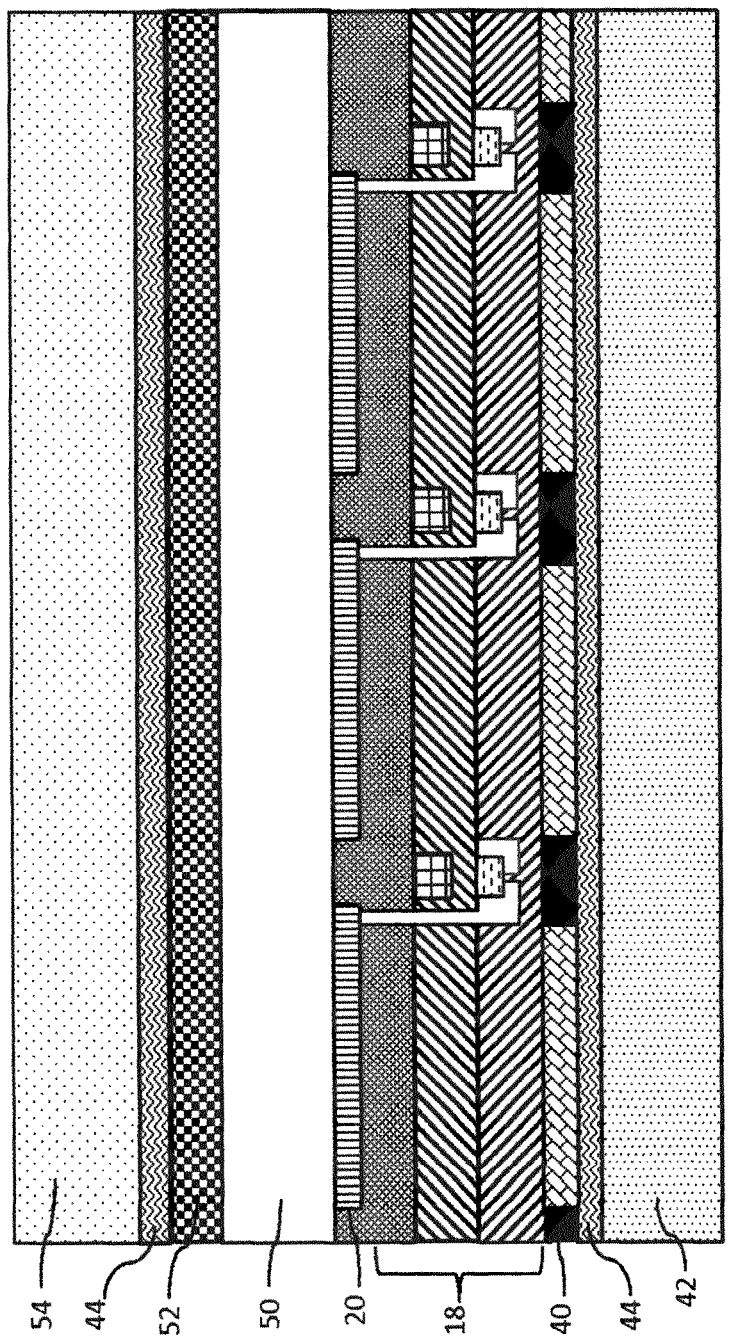
FIG. 3 is a simplified layer diagram of the flexible display/imager/sensor array covering three pixel elements.

As shown in FIG. 3, the display elements in the array share a non-patterned organic emitting/transport layer stack or non-patterned liquid-crystalline layer 50. In the case of an image array, layer 50 represents an image sensing layer typically in a p-i-n stack. The materials in the p-i-n stack can be organic, inorganic, or combinations thereof. The counter electrode 52 over display/sensor layer 50 is also a common electrode without pixel level patterning. A glue layer 44 and a flexible plastic passivation layer 54 can be added over counter electrode 52 thereby forming a flexible display/sensor array device.

Passivation layer 54 can also be in a curved (such as in cylindrical) shape. When the flexible device is finally glued to the surface of curved passivation layer 54, a predefined curved electronic device is formed. Such devices can be useful for certain applications, such as a sensor array with cylindrical focal plane for a 3-dimensional CT scanner.

In addition to display/photodetector applications, the flexible TFT backpanel shown in FIG. 2 and FIG. 3 can also be used for pixelated chemical and biosensor arrays. As an example, layer 50 in FIG. 3 can be a test sample in solid, solution, or gaseous phases. The counter electrode 52 can be in a solid film or in a meshed net. The meshed electrode 52 is especially favorable for solution and gaseous test samples. The TFT pixel circuit can not only readout the sensing signal at each pixel location, but also provide electric potential and/or current to each pixel location. Such chemical/biosensor array can thus be used for bio/chemical reactions in addition to the sensing function.

One of the challenges in the traditional TFT backplane art is that when fabricating color filters on TFT arrays for either LCD or OLED devices, the color filters cannot survive the TFT manufacturing process and, therefore, have to be fabricated on top of the TFT array (i.e. after TFT fabrication). On the other hand, electrodes for OLED or LCD devices must be at the top of the backplane and, thus, on top of the color filter layers. Thus, there must be a via connection through the color filter layers from each TFT below the color filter layers to the pixel electrodes that are on top of the color filter layers. The process of forming these vias through the color filter layers increases complexity of the overall process and reduces process yield. Moreover, the vias at the pixel level take significant real estate space so that such designs are not compatible with portable and wearable electronic devices, which require high pixel density and small pixel pitch. Therefore, in most display designs, color filters are fabricated on different pieces of glass and aligned to the TFT backplanes later.

In accordance with the present invention and referring to FIG. 2, because of the reversing process components at the top of the structure are fabricated first and components at the bottom of the structure are fabricated later or last. Thus, the pixel electrodes 20 are at the top and exposed to patterned pixel electrode pads for displays/sensors (not shown). In the reversing process of the present invention the electrodes are deposited below the TFTs in backplane 18 and color filter 40 is fabricated on top of or after the TFTs of backplane 18 so there is no need to provide a via through color filter 40. Electrodes 20 are fabricated before the TFTs of backplane 18 and can easily survive the manufacturing temperature. Fabrication of color filter 40 is performed after formation of backplane 18, which solves the compatibility issue and enables integrating color filter 40 onto TFT backplane 18 with no performance compromise, nor pixel dimension compromise.

The generic process flow or step-by-step method of fabricating reversed or reversible flexible TFT back-panel 10 is described in more detail below. After providing a suitable flat glass substrate 12, an etch stop layer 14 is deposited on glass substrate 12. Either borosilicate or sodalime type glass can be used. Optional buffer layer 16 is deposited on etch stop layer 14 to help protect the TFT during the subsequent removal of etch stop layer 14. The preferred etch stop layer is a thin layer of noble metal such as Au, Pt, or Pd. To enhance the adhesion to the overlying and underlying materials, optional thin glue layers such as Cr or Ti may be used on top and bottom of the noble metals. Because of the etch stop layer's super capability to survive the HF etch, the thickness of optional buffer layer 16 can be very thin. The main purpose of buffer layer 16 is to protect TFT backplane 18 during the removal of etch stop layer 14, after which the thin buffer layer 16 is etched away to reveal pixel electrodes or pads 20 for receiving OLED or LCD cells in electrical communication therewith.

After the formation of TFT backplane 18 and the color filter layer 40, the glass based structure is glued to flexible substrate 42. Flexible substrate 42 is thick enough to act as the mechanical support for further display processing and ultimate use. The top side of TFT backplane 18 is protected by its passivation layer 34 and flexible substrate 42. If flexible substrate 42 is not resistant to HF, it can be protected by an additional resist layer (not shown). The back side of backplane 18 (glass substrate 12) is then exposed. The whole structure is put into an HF bath with proper agitation, which removes glass substrate 12 and the HF etching process stops at etch stop layer 14. All devices, including TFT backplane 18, are protected against HF by etch stop layer 14. Etch stop layer 14 is then etched away using a different etchant. If optional buffer layer 16 is included, it is also etched away by the same or another different etchant, which is selected so as to not be harmful to TFT backplane 18. After removal of etch stop layer 14 and optional buffer layer 16, the electrodes 20 for an OLED or LCD matrix of cells are exposed. A complete TFT backplane on a flexible substrate is thus achieved.

It should be noted that any structures or process steps that require resolution (including color filter 40 and pixel electrodes) were accomplished with glass substrate 12 in place. With the existing lithography tools and processes available in display manufacturing lines, one could achieve design rules of 2-3 microns for metal lines and spaces. OLED and LCD display pixels down to 20 μm pitch can thus be achieved. The flexible TFT backpanel disclosed in this invention is thus suitable for high pixel density display, image-sensors, chemical and bio-sensor array devices.

After glass substrate 12 is removed, the structure is flipped upside down (reversed) on flexible substrate 42. The broad-band OLED or LCD fabrication does not require high resolution (i.e. no pixel level alignment and patterning are involved) nor is any high temperature involved. The geometrical dimensions and the performance of the TFT array (back-panel 10) are thus preserved through the OLED/LCD fabrication process. It is also worth noting that the exposed pixel electrode pads (electrodes 20) have flat front surfaces (i.e. planar with the surface of planarization layer 22), which eliminates the fringe effect related to edges of the pixel electrode. This saves a mask step for an additional bank layer used in conventional OLED display design. This flat pixel electrode surface is especially suitable for display/sensor layer(s) involving coating process or sensitive to local fringing field.

Following are four specific examples of processes for manufacturing flexible reversible TFT back-panels for different light emitting, light modulating, or image sensing devices.

Example 1

Twisted Nematic LCD

Provide flat glass substrate;
Deposit substrate etch stop layer;

Deposit and pattern LCD pixel electrodes (1st mask);
Deposit Planarization layer with via to electrodes (2nd mask);
Gate metal deposition and patterning 3rd mask);
Gate dielectric with via (4th mask);
Metal oxide isolation (5th mask);
Optional channel etch stop for S/D (6th mask);
S/D patterning (7th mask);
Passivation (blanket layer);
Color filter fabrication (typically with 4 resolution mask or printing steps);
Glued to carrier substrate with detachable flexible film;
Glass substrate removal; and
Substrate etch stop layer removal.

Example 2

Simplified Twisted Nematic LCD (Planarization of Electrodes can be Omitted for LCD)

Provide flat glass substrate;
Deposit substrate etch stop layer;
Deposit LCD pixel electrodes (1st mask);
Gate metal deposition and patterning (2nd mask);
Gate dielectric with via (3rd mask);
Metal oxide isolation (4th mask);
Optional channel etch stop for S/D (5th mask);
S/D patterning (6th mask);
Passivation (blanket layer);
Color filter fabrication (typically with 4 resolution masks or printing steps);
Glued to carrier substrate with detachable flexible film;
Glass substrate removal; and
Substrate etch stop layer removal.

Example 3

Further Simplified Twisted Nematic LCD (Further Simplification of the Process is Possible by Using the Same Transparent Conductor Both for the Gate and the LCD Electrode and Patterning Both in the Same Lithographic Step.)

Provide flat glass substrate;
Deposit substrate etch stop layer;
LCD and gate electrode patterning (1st mask);
Gate dielectric with via (2nd mask);
Metal oxide isolation (3rd mask);
Optional channel etch stop for S/D (4th mask);
S/D patterning (5th mask);
Passivation (blanket layer);
Color filter fabrication (4 masks);
Glued to carrier substrate with detachable flexible film;
Glass substrate removal; and
Substrate etch stop layer removal.

Example 4

OLED

Provide flat glass substrate;
Deposit substrate etch stop layer;
Deposit OLED pixel electrodes (1st mask);
Deposit Planarization layer with via to electrodes (2nd mask);
Gate metal patterning (3rd mask);
Gate dielectric with via (4th mask);
Metal oxide isolation (5th mask);
Optional channel etch stop for S/D (6th mask);
S/D patterning (7th mask);
Passivation (blanket layer);
Optional Color filter processes;
Glued to carrier substrate with detachable flexible film;
Glass substrate removal; and
Substrate etch stop layer removal.

In all examples, the planarization via, second mask, may not be needed if the gate dielectric via mask can be used to etch the planarization layer. One more mask saving with back-channel-etching type TFT (as shown in structure 18 of FIG. 1) is chosen.

Thus, a new and improved process for fabricating an inverted flexible TFT back-panel on a glass support has been disclosed. In the new and improved process for fabricating an inverted flexible TFT back-panel on a glass support member the step of removing the glass support member is performed prior to formation of display/sensor device processing. Also, in the new and improved process for fabricating an inverted flexible TFT back-panel on a glass support member the steps of removing the glass support member and inverting the TFT back-panel are performed prior to formation of display/sensor device processing. Since the OLED or LCD fabrication does not require high resolution (i.e. no pixel level alignment and patterning are involved) nor is any high temperature involved the performance of the TFT array (back-panel 10) is reserved through the OLED/LCD fabrication process.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A process of fabricating a flexible TFT back-panel on a glass support comprising the steps of:
   providing a flat glass support member having an upper surface;
   depositing a layer of etch stop material on the upper surface of the glass support member;
   depositing a display/photoimager/chem/bio-sensor pixel element contact pad overlying the layer of etch stop material;
   depositing gate metal overlying the etch stop material and patterning the gate metal to define a gate electrode of a TFT and connecting lines;
   depositing a layer of gate dielectric material overlying the contact pad and the gate metal, and forming a via through the layer of gate dielectric material in communication with the contact pad;
   depositing and patterning semiconductor material to form an active layer of the TFT overlying the gate electrode;
   depositing source/drain contact metal on the active layer and in the via in electrical contact with the contact pad and patterning the source/drain contact metal to define source and drain terminals of the TFT;
   depositing a layer of passivation material in overlying relationship to the TFT;
   forming a color filter on the layer of passivation material;
   affixing a flexible plastic carrier to the color filter; and etching the glass support member away and etching the layer of etch stop material away to expose a surface of the display/photoimager/chem/bio-sensor pixel element contact pad.

2. A process as claimed in claim 1 wherein the active layer is one of a metal-oxide semiconductor, an amorphous or polycrystalline silicon film, and an organic semiconductor.

3. A process as claimed in claim 1 wherein the display/photoimager/chem/bio-sensor pixel element contact pad is designed to connect to one of an LCD, an OLED, a chemical sensor and a biosensor.

4. A process as claimed in claim 1 further including a step of depositing a buffer layer on the layer of etch stop material prior to the step of depositing the display/photoimager/chem/bio-sensor pixel element contact pad.

5. A process as claimed in claim 4 wherein the buffer layer is selected to protect the display/photoimager/chem/bio-sensor pixel element contact pad during the step of etching the layer of etch stop material away to expose a surface of the display/photoimager/chem/bio-sensor pixel element contact pad.

6. A process as claimed in claim 1 further including the step of depositing a planarization layer over the display/photoimager/chem/bio-sensor pixel element contact pad and the step of depositing the gate metal includes depositing the gate metal on the planarization layer.

7. A process as claimed in claim 6 further including a step of forming a via through the planarization layer in alignment with the via through the layer of gate dielectric material.

8. A process as claimed in claim 1 further including a step of reversing the structure to position the display/photoimager/chem/bio-sensor pixel element contact pad at an upper surface and forming a display/photoimager/chem/bio-sensor pixel element on the upper surface in electrical contact with the contact pad.

9. A process as claimed in claim 1 wherein the step of depositing the layer of etch stop material includes depositing one of Au, Pt, and Pd.

10. A process as claimed in claim 9 wherein the layer of etch stop material is less than 200 nm thick.

11. A process of fabricating a flexible TFT back-panel on a glass support comprising the steps of:
providing a flat glass support member having an upper surface;
depositing a layer of etch stop material on the upper surface of the glass support member;
depositing a buffer layer on the layer of etch stop material;
depositing a matrix of display/photoimager/chem/bio-sensor pixel element contact pads overlying the layer of etch stop material;
depositing a planarization layer on the matrix of display/photoimager/chem/bio-sensor pixel element contact pads and surrounding buffer layer;
depositing gate metal on the planarization layer and patterning the gate metal to define a matrix of TFT gate electrodes and connecting lines for a matrix of TFTs;
depositing a layer of gate dielectric material on the matrix of TFT gate electrodes and connecting lines, and forming a via through the layer of gate dielectric material and planarization layer in communication with the contact pad for each TFT in the matrix of TFT gate electrodes;
depositing and patterning semiconductor material to form an active layer overlying the gate electrode for each TFT in the matrix of TFTs;
depositing source/drain contact metal on the active layer and in the via in electrical contact with the contact pad for each TFT in the matrix of TFTs, and patterning the source/drain contact metal to define source and drain terminals for each TFT in the matrix of TFTs;
depositing a layer of passivation material in overlying relationship to the matrix of TFTs;
forming a color filter on the layer of passivation material;
affixing a flexible plastic carrier to the color filter;
etching the glass support member away;
etching the layer of etch stop material away;
etching the buffer layer away to expose a surface of each display/photoimager/chem/bio-sensor pixel element contact pad of the matrix of display/photoimager/chem/bio-sensor pixel element contact pads, whereby a flexible TFT back-panel is provided.

12. A process as claimed in claim 11 wherein the active layer is a metal-oxide semiconductor film, an amorphous or polycrystalline silicon film, an organic semiconductor film.

13. A process as claimed in claim 11 wherein the matrix of display/photoimager/chem/bio-sensor pixel element contact pads is designed to connect one each to one of an LCD, an OLED, a chemical sensor and a biosensor.

14. A process as claimed in claim 11 wherein the buffer layer is selected to protect the display/photoimager/chem/bio-sensor pixel element contact pads during the step of etching the layer of etch stop material away to expose a surface of the display/photoimager/chem/bio-sensor pixel element contact pads.

15. A process as claimed in claim 11 further including a step of reversing the structure to position the display/photoimager/chem/bio-sensor pixel element contact pads at an upper surface and forming a matrix of display/photoimager/chem/bio-sensor pixel elements on the upper surface in electrical contact, one each in contact with one each of the matrix of contact pads.

16. A process as claimed in claim 11 wherein the step of depositing the layer of etch stop material includes depositing one of Au, Pt, and Pd.

17. A process as claimed in claim 16 wherein the layer of etch stop material is less than 200 nm thick.

18. A process of fabricating a flexible TFT back-panel on a glass support comprising the steps of:
providing a flat glass support member having an upper surface;
depositing a layer of etch stop material on the upper surface of the glass support member;
depositing a buffer layer on the layer of etch stop material;
depositing a matrix of OLED contact pads overlying the layer of etch stop material;
depositing a planarization layer on the matrix of OLED contact pads and surrounding buffer layer;
depositing gate metal on the planarization layer and patterning the gate metal to define a matrix of TFT gate electrodes and connecting lines for a matrix of TFTs;
depositing a layer of gate dielectric material on the matrix of TFT gate electrodes and connecting lines, and forming a via through the layer of gate dielectric material and planarization layer in communication with the contact pad for each TFT in the matrix of TFT gate electrodes;
depositing and patterning metal oxide semiconductor material to form an active layer overlying the gate electrode for each TFT in the matrix of TFTs;
depositing source/drain contact metal on the active layer and in the via in electrical contact with the contact pad for each TFT in the matrix of TFTs, and patterning the source/drain contact metal to define source and drain terminals for each TFT in the matrix of TFTs;

depositing a layer of passivation material in overlying relationship to the matrix of TFTs;
affixing a flexible plastic carrier to the layer of passivation material;
etching the glass support member away;
etching the layer of etch stop material away;
etching the buffer layer away to expose a surface of each of the OLED contact pads;
reversing the structure to position the matrix of OLED contact pads at an upper surface; and
forming a full color matrix of OLEDs on the upper surface in electrical, one each in contact with a contact pad of the matrix of contact pads.

* * * * *